United States Patent
Fujimoto et al.

(10) Patent No.: US 7,602,099 B2
(45) Date of Patent: Oct. 13, 2009

(54) SURFACE ACOUSTIC WAVE DEVICE AND METHOD OF MANUFACTURING THE SAME

(75) Inventors: Haruhiko Fujimoto, Fukushima-ken (JP); Kyosuke Ozaki, Fukushima-ken (JP); Satoshi Waga, Fukushima-ken (JP); Toshihiro Meguro, Fukushima-ken (JP); Takeshi Ikeda, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 527 days.

(21) Appl. No.: 11/409,189

(22) Filed: Apr. 21, 2006

(65) Prior Publication Data

US 2006/0273687 A1    Dec. 7, 2006

(30) Foreign Application Priority Data

Jun. 1, 2005    (JP)   ............... 2005-160952

(51) Int. Cl.
     *H01L 41/047*    (2006.01)

(52) U.S. Cl. ................................. 310/313 A

(58) Field of Classification Search ............ 310/313 A, 310/313 R, 313 B, 363–366; *H01L 41/047*
See application file for complete search history.

(56) References Cited

U.S. PATENT DOCUMENTS

| | | | |
|---|---|---|---|
| 5,500,329 A | 3/1996 | Kawai et al. | |
| 5,757,250 A | 5/1998 | Ichikawa | ................. 333/193 |
| 6,297,580 B1 | 10/2001 | Takayama et al. | |
| 6,542,285 B1 | 4/2003 | Batchko et al. | |
| 6,630,767 B2 | 10/2003 | Inoue et al. | |
| 7,180,223 B2 * | 2/2007 | Ozaki et al. | ............ 310/313 A |
| 2004/0086740 A1 | 5/2004 | Fujimoto et al. | |

FOREIGN PATENT DOCUMENTS

| | | |
|---|---|---|
| EP | 0657998 | 6/1995 |
| EP | 0 734 120 A1 | 9/1996 |
| EP | 1158668 | 11/2001 |
| EP | 1296451 | 3/2003 |
| EP | 1445793 | 8/2004 |
| EP | 1562288 | 8/2005 |
| EP | 1544998 | 8/2006 |

(Continued)

OTHER PUBLICATIONS

European Search Report dated Apr. 7, 2007 for European application No. 06010066.6-2215.

*Primary Examiner*—Walter Benson
*Assistant Examiner*—Karen B Addison
(74) *Attorney, Agent, or Firm*—Beyer Law Group LLP

(57) ABSTRACT

First base layers made of TiN or $TiO_xN_y$ (where, $0<x<0.2$, $x+y=1$) and second base layers made of Cr are provided between interdigital transducer portions and a piezoelectric substrate, and accordingly, it is possible to prevent voids from being generated in the interdigital transducer portions, which improves a power resistance of the surface acoustic wave device. In addition, since it is possible to prevent the voids from being generated in the interdigital transducer portions, it is possible to suppress the resistance of the interdigital transducer portions from increasing, which can reduce the loss of power. In addition, it is also possible to reduce the variations in a serial resonance frequency and a parallel resonance frequency.

15 Claims, 8 Drawing Sheets

FOREIGN PATENT DOCUMENTS

| | | |
|---|---|---|
| GB | 2130452 | 5/1984 |
| JP | 07-015274 | 1/1995 |
| JP | 2002-305425 | 10/2002 |
| WO | WO02/067423 | 8/2002 |
| WO | WO03/069775 | 8/2003 |
| WO | WO2004/066493 | 8/2004 |

* cited by examiner

SURFACE ACOUSTIC WAVE DEVICE AND METHOD OF MANUFACTURING THE SAME

BACKGROUND OF THE INVENTION

1. Field of the Invention

The present invention relates to a surface acoustic wave device having an electrode structure that can withstand high power at a high frequency band and a method of manufacturing the same.

2. Description of the Related Art

Surface acoustic wave devices are electronic components using surface acoustic waves which are propagated in a state in which mechanical vibration energy is concentrated around only surfaces of solid substances, and are used for filters, resonators, duplexers, etc.

In recent years, the trend in mobile communication terminals, such as mobile phones, are rapidly becoming smaller in size and lighter. For this reason, electronic components mounted on such mobile communication terminals should also be reduced in size.

A surface acoustic wave device has a configuration in which a pair of interdigital transducers (IDT electrodes) made of a conductive material is disposed on a piezoelectric substrate such that finger portions of the interdigital transducers are alternately arranged. The surface acoustic wave device having such a simple structure is suitable for filters, resonators, and duplexers that should be reduced in size when used for such mobile communication terminals.

In addition, when the surface acoustic wave device is used as a resonator, it is important that the variations in the serial resonance frequency and the parallel resonance frequency should be small when the device temperature changes.

In the related art, it has been known that the interdigital transducers and the piezoelectric substrate are covered with a silicon oxide layer so as to reduce the variations in the serial resonance frequency and the parallel resonance frequency due to the temperature change of the surface acoustic wave device.

However, in the case of the configuration in which the interdigital transducers and the piezoelectric substrate are covered with the silicon oxide layer, a problem occurs in that voids are generated in the interdigital transducers.

FIG. 11 is a plan view illustrating a conventional surface acoustic wave device. The surface acoustic wave device includes a piezoelectric substrate 12; and an interdigital transducer portion 13 and an interdigital transducer portion 14 formed on the piezoelectric substrate 12. In addition, the interdigital transducer portions 13 and 14 and the piezoelectric substrate 12 are covered with a silicon oxide layer, but the silicon oxide layer is not shown in FIG. 11. The interdigital transducer portions 13 and 14 are electrically connected to connection electrode portions 15 and 16 that are provided to connect the surface acoustic wave device to an external circuit. FIG. 12 is a cross-sectional view of the interdigital transducer portions 13 and 14 taken along the single-dotted chain line of FIG. 11, as viewed from the direction indicated by arrows. The interdigital transducer portions 13 and 14 and the piezoelectric substrate 12 are covered with a silicon oxide layer 10.

As shown in FIGS. 11 and 12, voids B are generated in the interdigital transducer portions 13 and 14. The voids B are generated because a material of the interdigital transducer portions 13 and 14 is lost due to thermal stress during a process in which the interdigital transducer portions 13 and 14 and the piezoelectric substrate 12 are coated with silicon compound and are then subjected to a thermal treatment under atmosphere of an oxygen and a moisture.

SUMMARY OF THE INVENTION

The invention has been finalized in view of the drawbacks inherent in the related art, and it is an object of the invention to provide a surface acoustic wave device that can withstand high power by suppressing voids from being generated in interdigital transducer portions and a method of manufacturing the same.

According to an aspect of the invention, a surface acoustic wave device includes a piezoelectric substrate and an electrode portion having a thin-film structure formed on the piezoelectric substrate. The electrode portion has an interdigital transducer portion and a connection electrode portion connected to the interdigital transducer portion. The interdigital transducer portion has a base layer and a main electrode layer laminated on the base layer. The base layer has a first base layer made of TiN or $TiO_xN_y$ (where, $0<x<0.2$, $x+y=1$) and a second base layer made of Cr.

In the invention, by providing the first base layer made of TiN or $TiO_xN_y$ (where, $0<x<0.2$, $x+y=1$) and the second base layer made of Cr between the interdigital transducer portion and the piezoelectric substrate, it is possible to prevent voids from being generated in the interdigital transducer portion, which improves the power resistance of the surface acoustic wave device. Further, if it is possible to prevent the voids from being generated in the interdigital transducer portion, it is possible to suppress the resistance of the interdigital transducer portion from increasing so as to reduce the loss of power. In addition, it is also possible to reduce the variations in the serial resonance frequency and the parallel resonance frequency.

Further, in the invention, since the first base layer and the second base layer are provided, the adhesion of the interdigital transducer portions with respect to the piezoelectric substrate is improved. As a result, it is possible to prevent the connection electrode portion from peeling off when the connection electrode portion is connected to a wiring member or when a wire bonding process is performed.

Since the voids are easily generated if the interdigital transducer portion is made of Cu or a Cu alloy, the invention is effective for the surface acoustic wave device having the interdigital transducer portion made of Cu or a Cu alloy.

Further, in the invention, preferably, the main electrode layer is made of a CuAg alloy.

Moreover, in the invention, preferably, a first protective layer made of TiN or $TiO_xN_y$ (where, $0<x<0.2$, $x+y=1$) is laminated on the main electrode layer.

Furthermore, in the invention, preferably, a second protective layer made of Cr is laminated on the first protective layer.

Furthermore, in the invention, preferably, the piezoelectric substrate is made of $LiTaO_3$ or $LiNbO_3$, for example. In particular, it is preferable that the piezoelectric substrate be made of $LiTaO_3$ having a Y-cut angle within a range of 36° to 60°.

Further, in the invention, preferably, the interdigital transducer portion and the piezoelectric substrate are covered with an insulating material having a temperature-elasticity constant variation characteristic opposite to a temperature-elasticity constant variation characteristic of the piezoelectric substrate.

By forming the insulating layer, it is possible to reduce the variations in the serial resonance frequency and the parallel resonance frequency due to the temperature change of the surface acoustic wave device.

In addition, preferably, when the insulating layer is formed on the piezoelectric substrate, the piezoelectric substrate is an $LiTaO_3$ substrate and the insulating material is silicon oxide or aluminum nitride.

In addition, the insulating layer is formed by using a spin-on-glass method in which, for example, silicon compound is coated on the piezoelectric substrate and is then subjected to a thermal treatment. Since the thermal treatment is performed under atmosphere of one of $O_2$ and $H_2O$ or both the $O_2$ and $H_2O$, the insulating layer becomes an oxide layer.

Further, in the invention, preferably, the main electrode layer having a face-centered cubic crystal structure is laminated on the first base layer having rock-salt crystal structure or a face-centered cubic crystal structure such that a {111} plane, which is a closest-packed plane, has a constant gradient with respect to a surface of the piezoelectric substrate. Thus, it is possible to suppress the electromigration or the stress migration. As a result, a breakage of electrodes and electrical breaks can be prevented, an insertion loss of elements can be decreased, and a Q-factor of resonators can be increased. Therefore, properties of the surface acoustic wave device can be improved.

Furthermore, if the {111} plane of the main electrode layer is parallel to the X axis of crystals of the piezoelectric substrate, the {111} plane, which is a closest-packed plane, crosses the amplitude direction of SH waves, and accordingly, the resistance to the electromigration or the stress migration is improved.

Further, in the invention, preferably, a {111} plane of the first base layer has a constant gradient with respect to the surface of the piezoelectric substrate.

Furthermore, in the invention, if the film thickness of the second base layer is within a range of 0.5 to 10 nm, the main electrode layer can have a twin crystal structure of which a crystal grain boundary is linear. Accordingly, the power resistance of the surface acoustic wave device can be improved. In addition, it is more preferable that the film thickness of the second base layer is within a range of 0.5 to 2 nm.

According to another aspect of the invention, a method of manufacturing a surface acoustic wave device has the following processes.

That is, the method of manufacturing the surface acoustic wave device includes: forming an interdigital transducer portion and a connection electrode portion connected to the interdigital transducer portion, the interdigital transducer portion being formed by laminating a first base layer made of TiN, a second base layer made of Cr, and a main electrode layer made of a conductive material on a piezoelectric substrate; forming an insulating layer by coating an insulating material on the piezoelectric substrate and the interdigital transducer portion, the insulating material having a temperature-elasticity constant variation characteristic opposite to a temperature-elasticity constant variation characteristic of the piezoelectric substrate; and performing a thermal treatment on the insulating layer.

In the invention, by providing the first base layer made of TiN or $TiO_xN_y$ (where, $0<x<0.2$, $x+y=1$) and the second base layer made of Cr between the interdigital transducer portion and the piezoelectric substrate, it is possible to prevent voids from being generated in the interdigital transducer portion, which improves the power resistance of the surface acoustic wave device. Further, if it is possible to prevent the voids from being generated in the interdigital transducer portion, it is possible to suppress the resistance of the interdigital transducer portion from increasing so as to reduce the loss of power. In addition, it is also possible to reduce the variations in the serial resonance frequency and the parallel resonance frequency due to the temperature change of the surface acoustic wave device.

Further, in the invention, since the first base layer and the second base layer are provided, the adhesion of the interdigital transducer portions with respect to the piezoelectric substrate is improved. As a result, it is possible to prevent the connection electrode portion from peeling off when the connection electrode portion is connected to a wiring member or when a wire bonding process is performed.

Furthermore, since the interdigital transducer portion and the piezoelectric substrate are covered with the insulating material having a temperature-elasticity constant variation characteristic opposite to a temperature-elasticity constant variation characteristic of the piezoelectric substrate, it is possible to reduce the variations in the serial resonance frequency and the parallel resonance frequency due to the temperature change of the surface acoustic wave device.

When the piezoelectric substrate is formed by using $LiTaO_3$ and the insulating layer has silicon oxide as a main component due to the silicon compound used as the insulating material, the temperature-elasticity constant variation characteristic of the piezoelectric substrate can be opposite to the temperature-elasticity constant variation characteristic of the insulating layer.

The temperature-elasticity constant variation characteristic of the substrate or the insulating layer means the direction and size of the elasticity constant variation when the temperature thereof changes. For example, in the case of $LiTaO_3$, if the temperature rises, the elasticity constant decreases. On the other hand, in the case of the silicon oxide, if the temperature rises, the elasticity constant increases. At this time, the temperature-elasticity constant variation characteristic of $LiTaO_3$ is opposite to the temperature-elasticity constant variation characteristic of the silicon oxide.

In addition, the insulating layer is formed by using a spin-on-glass method in which, for example, silicon compound is coated on the piezoelectric substrate and is then subjected to a thermal treatment. Since the thermal treatment is performed under atmosphere of one of $O_2$ and $H_2O$ or both the $O_2$ and $H_2O$, the insulating layer becomes an oxide layer.

In the invention, in order to reduce the variations in the serial resonance frequency and the parallel resonance frequency due to the temperature change of the surface acoustic wave device and to improve the Q-factor of the surface acoustic wave device, it is preferable that the thermal treatment be performed at a temperature of 450° C. or more. However, if the temperature of the thermal treatment is high, voids are easily generated in the interdigital transducer portion.

In the invention, since the first base layer and second base layer are provided between the interdigital transducer portion and the piezoelectric substrate, it is possible to prevent the voids from being generated even though the temperature of the thermal treatment is high.

If it is possible to raise the temperature of the thermal treatment, the film thickness of the insulating layer can be made large. By making the film thickness of the insulating layer large, it is possible to reduce the variations even more in the serial resonance frequency and the parallel resonance frequency due to the temperature change of the surface acoustic wave device and to further improve the Q-factor of the surface acoustic wave device.

Furthermore, in the invention, if the film thickness of the second base layer is within a range of 0.5 to 10 nm, the main electrode layer can have a twin crystal structure of which a crystal grain boundary is linear. Accordingly, the power resistance of the surface acoustic wave device can be improved.

In addition, in the invention, preferably, the main electrode layer is made of Cu or a Cu alloy. In particular, it is more preferable that the main electrode layer be made of a CuAg alloy.

According to the invention, since the first base layer made of TiN or TiO$_x$N$_y$ (where, 0<x<0.2, x+y=1) and the second base layer made of Cr are provided between the interdigital transducer portion and the piezoelectric substrate, it is possible to prevent voids from being generated in the interdigital transducer portion, which improves the power resistance of the surface acoustic wave device. Further, if it is possible to prevent the voids from being generated in the interdigital transducer portion, it is possible to suppress the resistance of the interdigital transducer portion from increasing so as to reduce the loss of power. In addition, it is also possible to reduce the variations in the serial resonance frequency and the parallel resonance frequency.

Further, according to the invention, since the first base layer and the second base layer are provided, the adhesion of the interdigital transducer portions with respect to the piezoelectric substrate is improved. As a result, it is possible to prevent the connection electrode portion from peeling off when the connection electrode portion is connected to a wiring member or when a wire bonding process is performed.

Furthermore, according to the invention, since the interdigital transducer portion and the piezoelectric substrate are covered with the insulating material having a temperature-elasticity constant variation characteristic opposite to a temperature-elasticity constant variation characteristic of the piezoelectric substrate, it is possible to reduce the variations in the serial resonance frequency and the parallel resonance frequency due to the temperature change of the surface acoustic wave device.

In addition, according to the invention, since the main electrode layer having a face-centered cubic crystal structure is laminated on the first base layer having rock-salt crystal structure or a face-centered cubic crystal structure such that a {111} plane, which is a closest-packed plane, has a constant gradient with respect to a surface of the piezoelectric substrate, it is possible to suppress the electromigration or the stress migration. As a result, since a breakage of electrodes and electrical breaks can be prevented, an insertion loss of elements can be decreased, and a Q-factor of resonators can be increased, the properties of the surface acoustic wave device can be improved.

Furthermore, according to the invention, since the {111} plane, which is a closest-packed plane, crosses the amplitude direction of SH waves if the {111} plane of the main electrode layer is parallel to the X axis of crystals of the piezoelectric substrate, the resistance to the electromigration or the stress migration can be improved.

In addition, according to the invention, since the main electrode layer can have a twin crystal structure of which a crystal grain boundary is linear if the film thickness of the second base layer is within a range of 0.5 to 10 nm, the power resistance of the surface acoustic wave device can be improved.

In addition, according to the invention, since the first base layer and second base layer are provided between the interdigital transducer portion and the piezoelectric substrate, it is possible to prevent the voids from being generated even though the temperature of the thermal treatment is high.

Since it is possible to raise the temperature of the thermal treatment, it is possible to reduce the variations even more in the serial resonance frequency and the parallel resonance frequency due to the temperature change of the surface acoustic wave device and to further improve the Q-factor of the surface acoustic wave device.

Further, since it is possible to raise the temperature of the thermal treatment, the film thickness of the insulating layer can be made large. By making the film thickness of the insulating layer large, it is possible to reduce the variations even more in the serial resonance frequency and the parallel resonance frequency due to the temperature change of the surface acoustic wave device and to further improve the Q-factor of the surface acoustic wave device.

11: SURFACE ACOUSTIC WAVE DEVICE
12: PIEZOELECTRIC SUBSTRATE
13, 14: INTERDIGITAL TRANSDUCER PORTION
15, 16: CONNECTION ELECTRODE PORTION
17, 18: ELECTRODE PORTION
19: REFLECTIVE ELECTRODE
20, 24: FIRST BASE LAYER
21, 25: SECOND BASE LAYER
22, 26: MAIN ELECTRODE LAYER
23, 27: FIRST PROTECTIVE LAYER
30, 31: SECOND PROTECTIVE LAYER
32: INSULATING LAYER

DESCRIPTION OF THE PREFERRED EMBODIMENT

Figure 1:
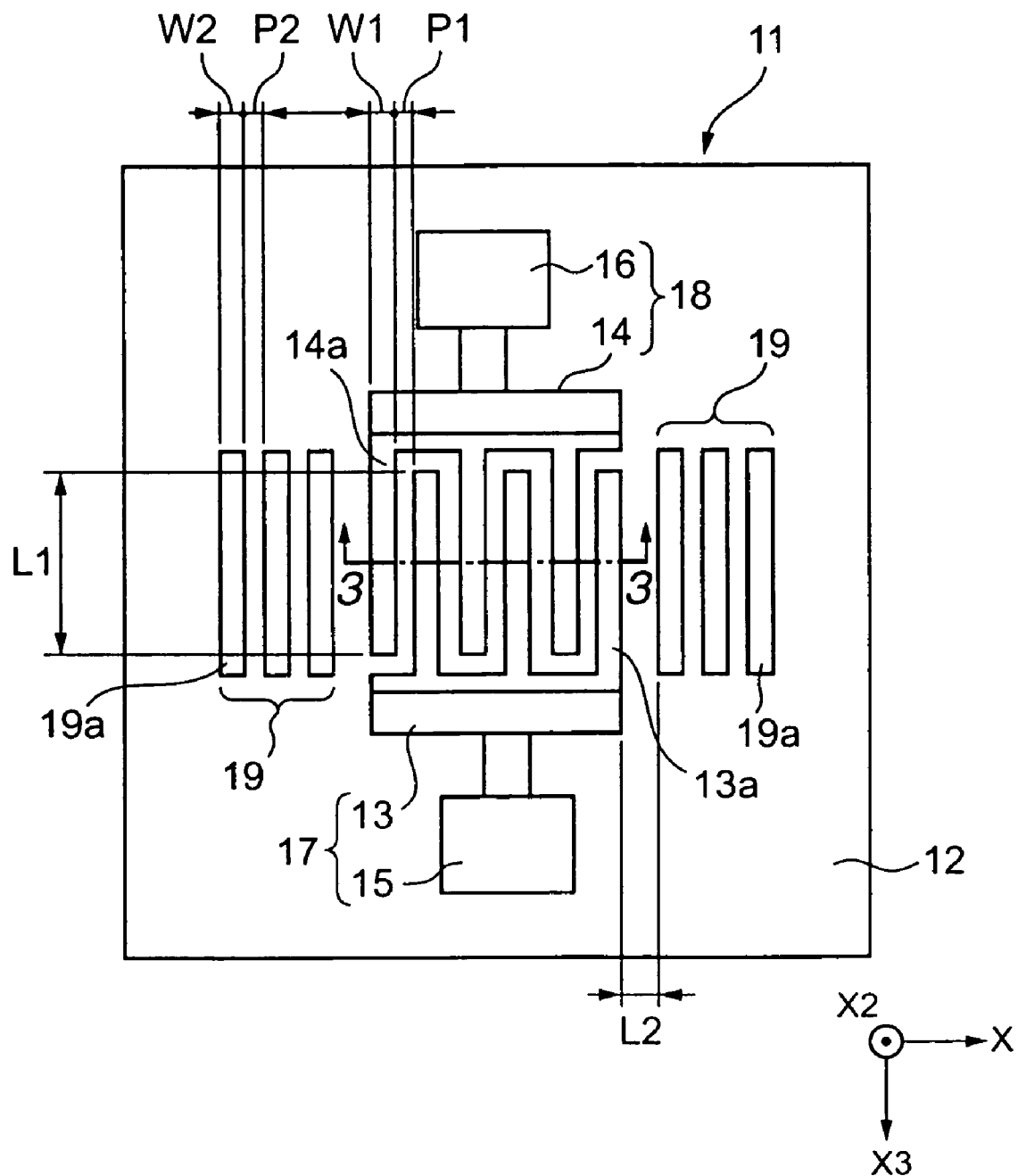
FIG. 1 is a plan view illustrating a surface acoustic wave device according to an embodiment of the invention.

FIG. 1 is a plan view illustrating a surface acoustic wave device according to an embodiment of the invention.

Reference numeral 11 represents the surface acoustic wave device, which functions as a branching filter. Reference numeral 12 represents a piezoelectric substrate. In the present embodiment, the piezoelectric substrate 12 is made of a piezoelectric ceramic material, such as LiTaO$_3$ or LiNbO$_3$, having a trigonal crystal structure.

On the piezoelectric substrate 12, an interdigital transducer portion 13 and an interdigital transducer portion 14 are formed. The interdigital transducer portion 13 is formed with an electrode fingers 13a extending in a direction opposite to an X3 direction shown in FIG. 1, and the interdigital transducer portion 14 is formed with electrode fingers 14a extending in the X3 direction. The electrode fingers 13a of the interdigital transducer portion 13 and the electrode fingers 14a of the interdigital transducer portion 14 are alternately arranged at predetermined intervals in the X direction shown in FIG. 1.

Further, a connection electrode portion 15 and a connection electrode portion 16, which are used to connect the surface acoustic wave device to an external circuit, are electrically connected to the interdigital transducer portion 13 and the interdigital transducer portion 14, respectively. The interdigital transducer portion 13 and the connection electrode portion 15 form an electrode portion 17, and the interdigital transducer portion 14 and the connection electrode portion 16 form an electrode portion 18.

Furthermore, reflective electrodes 19 are formed so as to be adjacent to the interdigital transducer portions 13 and 14 in the X direction and the direction opposite to the X direction, respectively. In FIG. 1, ends of the respective electrodes forming the reflective electrodes 19 are opened. However, the ends of the respective electrodes forming the reflective electrodes 19 may be short-circuited.

Figure 2:
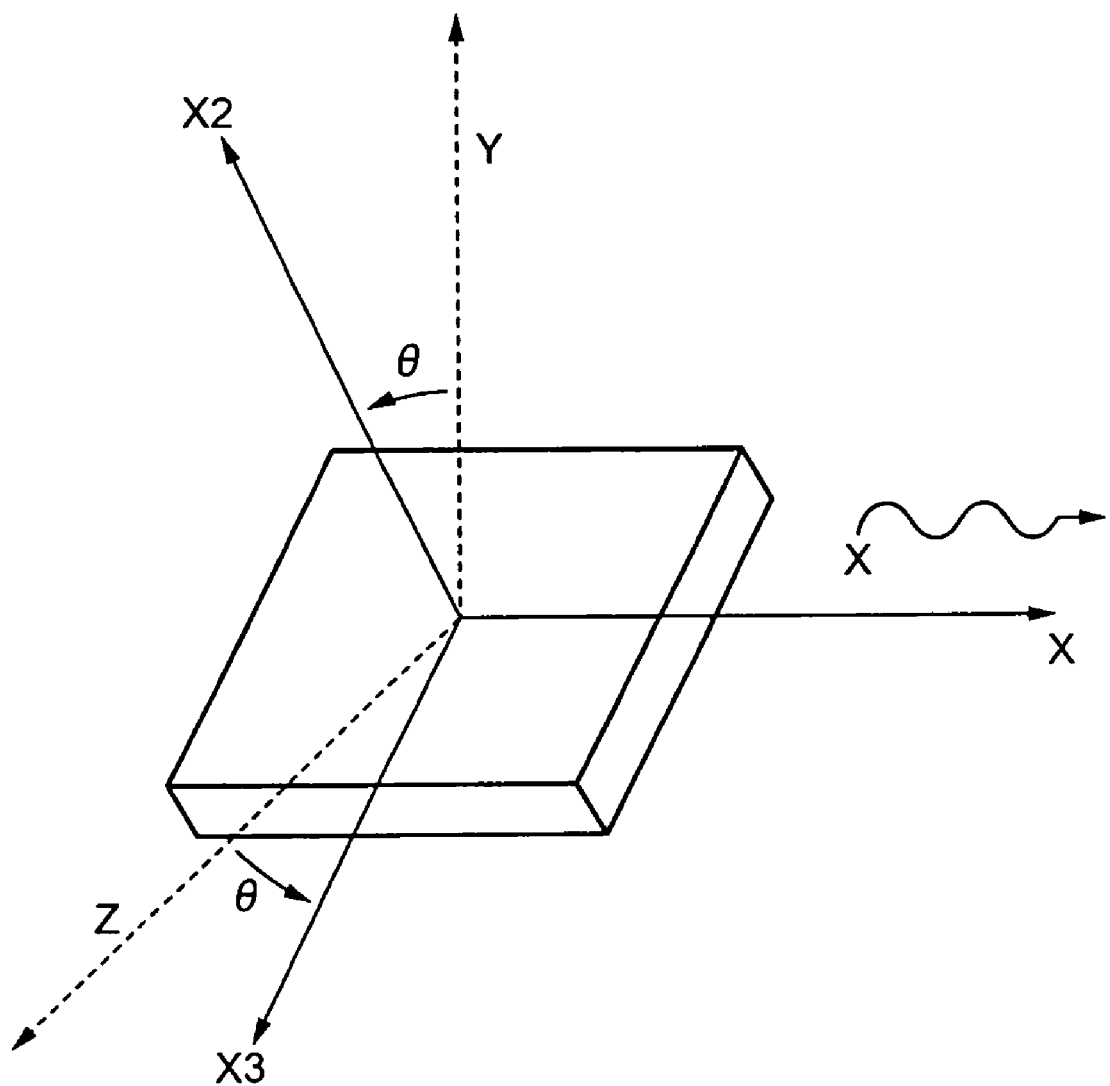
FIG. 2 is a view explaining a cut angle of a monocrystal piezoelectric substrate.

FIG. 2 illustrates a LiTaO$_3$ monocrystal, which has crystal axes X, Y, and Z, cut in the state in which the LiTaO$_3$ monocrystal tilts from the Y axis toward the Z axis by the rotation angle θ around the crystal axis X. Such a piezoelectric substrate is referred to as a θ-rotated Y-cut LiTaO$_3$ substrate. In addition, the rotation angle θ is referred to as a rotational cut angle or a cut angle.

Figure 3:
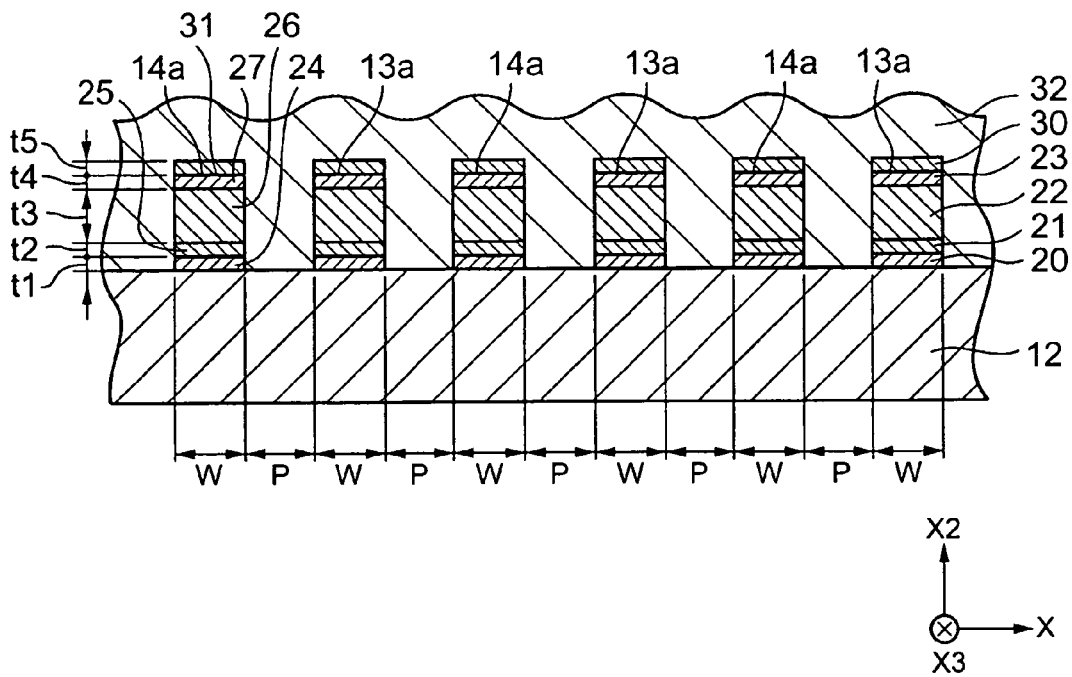
FIG. 3 is a cross-sectional view of the surface acoustic wave device taken along the line III-III of FIG. 1.

FIG. 3 is a longitudinal cross-sectional view of the interdigital transducer portion 13 and the interdigital transducer portion 14 taken along the line III-III of FIG. 1 as viewed from a direction indicated by the arrows.

In the present embodiment, the interdigital transducer portion 13 has a laminated structure including a first base layer 20, a second base layer 21, a main electrode layer 22 laminated so as to come in contact with an upper surface of the second base layer 22, a first protective layer 23 laminated on the main electrode layer 22, and a second protective layer 30. Similarly, the interdigital transducer portion 14 has a laminated structure including a first base layer 24, a second base layer 25, a main electrode layer 26 laminated so as to come in contact with an upper surface of the second base layer 25, a first protective layer 27 laminated on the main electrode layer 26, and a second protective layer 31. The first protective layer 23 and the first protective layer 27 are made of TiN (titanium nitride) or TiO$_x$N$_y$ (where 0<x<0.2, x+y=1). The second protective layer 30 and the second protective layer 31 are made of Cr (chromium).

The first base layers 20 and 24 are made of TiN (titanium nitride) or TiO$_x$N$_y$ (where, 0<x<0.2, x+y=1). The pitch between the nearest neighbor atoms of crystals of those materials is within the range of 2.40 to 3.30 Å.

TiN (titanium nitride) and TiO$_x$N$_y$ (where, 0<x<0.2, x+y=1) have rock-salt crystal structures or face-centered cubic crystal structures.

The second base layers 21 and 25 are made of Cr (chromium). The Cr has a body-centered cubic crystal structure.

As a material of the main electrode layers 22 and 26, one or more selected from the group consisting of copper (Cu), aluminum (Al), platinum (Pt), gold (Au), and silver (Ag) are used. Alternatively, as the material of the main electrode layers 22 and 26, an alloy of one or more selected from the group consisting of Cu, Al, Pt, Au, and Ag, and one or more selected from the group consisting of Ag, tin (Sn), carbon (C), scandium (Sc), and Cu may be used. More specifically, an AlScCu alloy, a CuAg alloy, or a CuScAg alloy may be used. It is preferable that the contents of Ag, Sn, and C, which are additive elements, be set to be within the range in which the specific gravity of a Cu alloy becomes approximately equal to that of pure Cu. Specifically, if the percent by mass of an additive element contained in the Cu alloy is within the range of 0.5 to 10.0 mass % (percent by mass), the specific gravity of the Cu alloy becomes approximately equal to that of pure Cu.

The pitch between the nearest neighbor atoms of crystals of such a material is within the range of 2.50 to 3.00 Å. Cu, Al, Pt, Au, Ag, and the above-mentioned alloys all have a face-centered cubic crystal structure.

If the first base layers 20 and 24 are made of TiN, there is a case in which oxygen of LiTaO$_3$ of the piezoelectric substrate is combined with unnitrogenized Ti, and accordingly, oxygen of LiTaO$_3$ is removed. On the other hand, if the first base layers 20 and 24 are made of TiO$_x$N$_y$, Ti becomes stabilized, and thus oxygen of LiTaO$_3$ is not removed. Here, if the oxygen content of the TiO$_x$N$_y$ becomes high, the electrical conductivity is lowered. Accordingly, it is preferable to select the oxygen content satisfying the 0<x<0.2 and x+y=1.

By providing the first base layers 20 and 24 made of TiN or TiO$_x$N$_y$ (where, 0<x<0.2, x+y=1) and the second base layers 21 and 25 made of Cr between the main electrode layers 22 and 26 and the piezoelectric substrate 12, it is possible to prevent voids from being generated in the interdigital transducer portions 13 and 14, which improves the power resistance of the surface acoustic wave device. Further, if it is possible to prevent the voids from being generated in the interdigital transducer portions 13 and 14, it is possible to suppress the resistance of the interdigital transducer portions 13 and 14 from increasing so as to reduce the loss of power. In addition, it is also possible to reduce the variations in the serial resonance frequency and the parallel resonance frequency.

Further, in the present embodiment, by providing the second base layers 21 and 25 between the first base layers 20 and 24 and the main electrode layers 22 and 26, the adhesion of the interdigital transducer portions 13 and 14 with respect to the piezoelectric substrate 12 is improved. As a result, it is possible to prevent the connection electrode portions 15 and 16 from peeling off when the connection electrode portions 15 and 16 are connected to a wiring member or when a wire bonding process is performed.

Since the voids are easily generated if the interdigital transducer portions 13 and 14 are made of Cu or a Cu alloy, it is effective to provide the first base layers 20 and 24 and the second base layers 21 and 25 for the surface acoustic wave device in which the interdigital transducer portions 13 and 14 are made of Cu or the Cu alloy.

The piezoelectric substrate 12 and the interdigital transducer portions 13 and 14 are covered with an insulating layer 32. The connection electrode portions 15 and 16 are exposed without being covered by the insulating layer 32. In FIG. 1, the insulating layer 32 is not shown so as to clearly illustrate the plan structure of the electrode portions 17 and 18 and the reflective electrodes 19 formed on the piezoelectric substrate 12.

When the piezoelectric substrate 12 is made of LiTaO$_3$, the insulating layer 32 is made of silicon oxide SiO$_2$, for example. Here, an insulating thin layer, which is made of silicon oxide SiO$_2$ and is formed by a sputtering method, may be formed on the interdigital transducer portions 13 and 14.

A temperature-elasticity constant variation characteristic of a substrate or an insulating layer means the direction and size of the elasticity constant variation when the temperature thereof changes. For example, in the case of LiTaO$_3$, if the temperature rises, the elasticity constant decreases. On the other hand, in the case of the silicon oxide, if the temperature rises, the elasticity constant increases. At this time, the temperature-elasticity constant variation characteristic of LiTaO$_3$ is opposite to the temperature-elasticity constant variation characteristic of the silicon oxide.

When the piezoelectric substrate 12 and the insulating layer 32 are formed by using LiTaO$_3$ and silicon oxide whose temperature-elasticity constant variation characteristics are opposite to each other, it is possible to reduce the variations even more in the serial resonance frequency and the parallel resonance frequency due to the temperature change of the surface acoustic wave device. When the insulating layer 32 is formed by using the silicon oxide, it is preferable to use a spin-on-glass method in which, for example, silicon compound is coated on the piezoelectric substrate and is then subjected to a thermal treatment. The thermal treatment may be performed under the atmosphere of one of O$_2$ and H$_2$O or both the O$_2$ and H$_2$O. As a result, the insulating layer 32 becomes an oxide layer.

In addition, the LiTaO$_3$ and aluminum nitride (AlN) have a relationship in which a temperature-elasticity constant variation characteristic of the LiTaO$_3$ is opposite to that of the aluminum nitride.

Further, although not shown in FIG. 3, in the present embodiment, the reflective electrodes 19 are also covered with the insulating layer 32 with an insulating thin film 20 interposed therebetween.

Furthermore, in the present embodiment, the insulating layer 32 is a thin film having a uniform density. In addition, 'the insulating layer 32 has a uniform density' means that an insulating material exists over the entire region of the insulating layer 32 without voids or breakage in the inside of the insulating layer 32, in particular, around the interdigital transducer portions.

When one of the connection electrode portion 25 and the connection electrode portion 26 of the surface acoustic wave device 21 is set to a ground side and a high-frequency signal is supplied to the other electrode portion, surface waves are excited on the surface of the piezoelectric substrate 12 and the excited surface waves propagate in the shown X direction and an anti-parallel direction of the X direction (not shown). The surface waves are reflected by the reflective electrodes 19 and return to the interdigital transducer portions 13 and 14. The surface acoustic wave device 21 has a resonant frequency and an anti-resonant frequency, and has the highest impedance at the anti-resonant frequency.

In the present embodiment, the piezoelectric substrate 12 made of LiTaO$_3$ is a Y-cut LiTaO$_3$ substrate in which a cut angle θ rotating from a Y axis toward a Z axis by around an X axis is within a range of 36° to 60°.

In the embodiment shown in FIGS. 1 and 3, the interdigital transducer portion 13 and the interdigital transducer portion 14 have the same width W, and the pitch P between the electrode fingers is constant. The width dimension W of each of the interdigital transducer portions 13 and 14 is within a range of 0.3 to 0.7 μm, and the distance width P is within a range of 0.3 to 0.7 μm.

Further, the film thickness t1 of each of the first base layers 20 and 24 is within the range of 5 to 20 nm, the film thickness t2 of each of the second base layers 21 and 25 is within the range of 0.5 to 10 nm, the film thickness t3 of each of the main electrode layers 22 and 26 is within the range of 80 to 180 nm, the film thickness t4 of each of the first protective layers 23 and 27 is within the range of 5 to 20 nm, and the film thickness t5 of each of the second protective layers 30 and 31 is within the range of 5 to 20 nm. If the film thickness t1 of each of the first base layers 20 and 24 is equal to or more than 5 nm and the film thickness t2 of each of the second base layers 21 and 25 is within the range of 0.5 to 10 nm, a {111} plane of each of the second base layers 21 and 25 and the main electrode layers 22 and 26 has a definitely constant gradient with respect to a surface of the piezoelectric substrate 12. In addition, if the film thickness t2 of each of the second base layers 21 and 25 is within the range of 0.5 to 10 nm, each of the main electrode layers 22 and 26 can have a twin crystal structure of which a crystal grain boundary is linear. Accordingly, the power resistance of the surface acoustic wave device can be improved. In addition, it is preferable that the film thickness t2 of each of the second base layers 21 and 25 be within the range of 0.5 to 2 nm.

Figure 4:
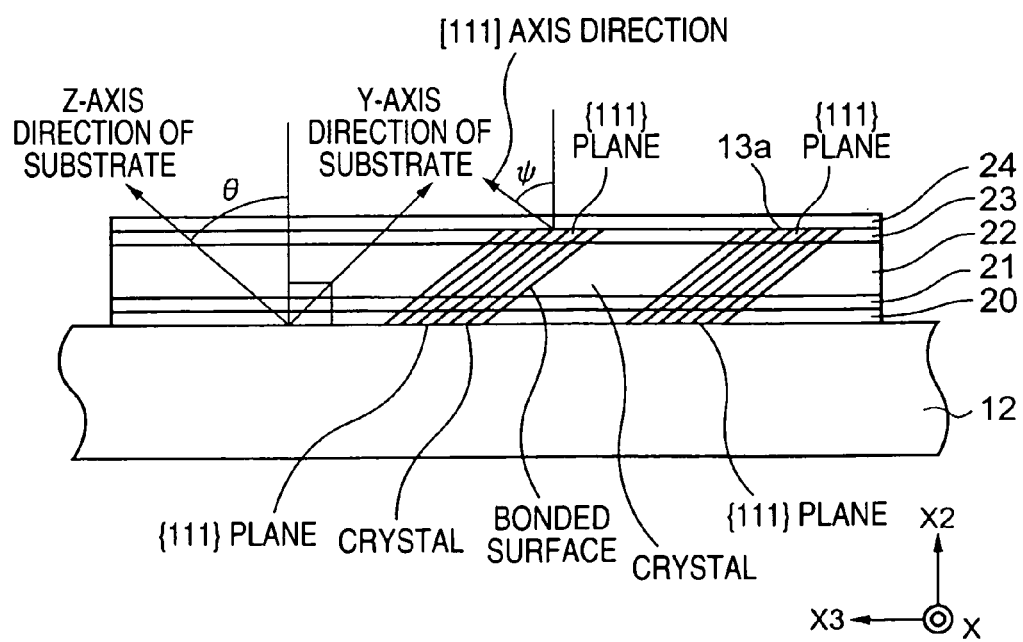
FIG. 4 is a side view illustrating an interdigital transducer portion of the surface acoustic wave device according to the invention.

FIG. 4 is a side view illustrating the electrode finger 13a of the interdigital transducer portion 13. As shown in FIG. 4, the crystal of the main electrode layer 22 has a face-centered cubic structure, and the {111} plane thereof has a constant gradient which is an acute angle with respect to the surface of the piezoelectric substrate 12. The constant gradient is, for example, 51° and is equal to a value of an angle Φ from a substrate normal direction in a [111] direction of the main electrode layer 22. The interdigital transducer portion 14 also has the same structure.

In such a manner, if the main electrode layer is laminated such that the {111} plane, which is a closest-packed plane, has the constant gradient with respect to the surface of the piezoelectric substrate 12, the electromigration or the stress migration of the interdigital transducer portions 13 and 14 can be suppressed. As a result, a breakage of electrodes and electrical breaks can be prevented, an insertion loss of elements can be decreased, and a Q-factor of resonators can be increased. Therefore, properties of the surface acoustic wave device can be improved.

Further, as shown in FIG. 4, if the {111} plane of each of the main electrode layers 22 and 26 is parallel to the X axis of crystals of the piezoelectric substrate, the {111} plane serving as the closest-packed plane crosses an amplitude direction of shear horizontal (SH) waves. Thus, the resistance to electromigration or stress migration can be improved.

Further, the closest-packed plane of the first base layer 20 ({111} plane in the case of the face-centered cubic crystal) has a constant gradient with respect to the surface of the piezoelectric substrate 12. In FIG. 4, the gradient of the {111} plane of the first base layer 20 and the gradient of the {111} plane of the main electrode layer 22 are equal to each other, both of which are the face-centered cubic crystal. This is the same for the interdigital transducer portion 14.

Moreover, since the first protective layers 23 and 27 and the second protective layers 30 and 31 are laminated on the main electrode layers 22 and 26, the crystal structure of each of the main electrode layers 22 and 26 is stabilized, and thus the resistance to electromigration or stress migration can be improved. Alternatively, the first protective layers 23 and 27 and the second protective layers 30 and 31 may not be formed.

The interdigital transducer portions 13 and 14 of the surface acoustic wave device in the present embodiment are preferably formed by using a sputtering method or an evaporation method.

First, a surface of the piezoelectric substrate 12 is preprocessed by means of ion etching or the like, and a crystal surface to be epitaxially grown on the surface of the piezoelectric substrate 12 is exposed. On the crystal plane of the piezoelectric substrate 12, the first base layers 20 and 24, the second base layers 21 and 25, and the main electrode layers 22 and 26 are formed by using the sputtering method or the evaporation method, such that the first base layers 20 and 24 and the main electrode layers 22 and 26 are formed as a layer having crystals which are predominantly oriented in the {111} direction. Further, the first base layers 20 and 24 and the main electrode layers 22 and 26 may be formed such that the {111} plane has the constant gradient with respect to the surface of the piezoelectric substrate 12. By using the sputtering method or the evaporation method, the crystals of the main electrode layers 22 and 26 can be easily heteroepitaxially grown on the crystals of the first base layers 20 and 24 and the second base layers 21 and 25.

In order to heteroepitaxially deposit the main electrode layers 22 and 26 on the first base layers 20 and 24 and the second base layers 21 and 25, respectively, after atoms of the material of the main electrode layers 22 and 26 which are struck from a target substrate reach the second base layers 21 and 25, energy sufficient for the atoms of the main electrode layers 22 and 26 to moderately move on the second base layers 21 and 25 is necessary so that the atoms of the main electrode layers 22 and 26 can be rearranged according to the atomic arrangement of the second base layers 21 and 25.

In order to increase the energy of the atoms of the main electrode layers 22 and 26, it is important to control a pressure of a sputter gas for striking the target. If the pressure of the sputter gas becomes excessively large, the collision frequency of the atoms of the material of the main electrode layers 22 and 26 and molecules of the sputter gas increases. As a result, energy is lost until the atoms of the material of the main electrode layers 22 and 26 reach the base layers 21 and 25. For this reason, the pressure of the sputter gas is preferably low, but if the pressure is too low, a stable discharge can not be maintained.

Therefore, the pressure of the sputter gas for striking the target is preferably within a range of $5 \times 10^{-4}$ Torr ($6.7 \times 10^{-2}$ Pa) to $3 \times 10^{-2}$ Torr (4 Pa). In the present embodiment, an argon (Ar) gas is used as the sputter gas and the pressure of the sputter gas is $1.5 \times 10^{-3}$ Torr (0.2 Pa).

Further, if the temperature of the substrate on becomes high, the atoms of the material of the main electrode layers 22 and 26, which reach the second base layers 21 and 25 from the target, can easily move on the second base layers 21 and 25. As a result, the atoms of the material of the main electrode layers 22 and 26 are easily rearranged according to the atomic arrangement of the second base layers 21 and 25. However, if the temperature of the substrate on which the second base layers 21 and 25 are formed becomes excessively high, the significant interdiffusion of the atoms at interfaces between the second base layers 21 and 25 and the main electrode layers 22 and 26 occurs, which is not preferable.

Accordingly, the temperature of the substrate on which the second base layers 21 and 25 are formed is preferably within a range of 0 to 100° C.

In order to increase the energy when the atoms of the material of the main electrode layers 22 and 26 reach the second base layers 21 and 25, it is preferable to set the distance between the target and the substrate on which the second base layers 21 and 25 are formed to be short so that the collision frequency of the atoms of the material of the main electrode layers 22 and 26 and the molecules of the sputter gas can be decreased. However, if the distance between the target and the substrate on which the second base layers 21 and 25 are formed is excessively short, the temperature of the substrate on which the second base layers 21 and 25 are formed becomes excessively high due to secondary electrons from the target or radiation heat. As a result, the significant interdiffusion of the atoms at the interfaces between the second base layers 21 and 25 and the main electrode layers 22 and 26 occurs, which is not preferable. In addition, if the distance between the target and the substrate on which the second base layers 21 and 25 becomes short, it is difficult to form the main electrode layers 22 and 26 such that the main electrode layers 22 and 26 have a uniform film thickness.

Therefore, the distance between the target and the substrate on which the second base layers 21 and 25 are formed is preferably within a range of 50 to 300 mm. In the present embodiment, the distance between the target and the substrate on which the second base layers 21 and 25 are formed is set to 89 mm.

After forming the electrode portions 17 and 18 and the reflective electrodes 19, silicon compound, such as polysilazane, is coated on the piezoelectric substrate 12 and the interdigital transducer portions 13 and 14 by using a spin coat method. Then, a baking process is performed at the temperature of 150° C. and under atmosphere of nitride for three minutes so as to remove dibutylether solvent. Then, a curing process is performed at the temperature of 450° C. and under atmosphere of oxygen ($O_2$) and moisture ($H_2O$) for thirty minutes. The curing process causes ammonia $NH_3$ or $H_2$ to be removed, and accordingly, the insulating layer 32 has silicon oxide as a main component.

First Example

Figure 5:
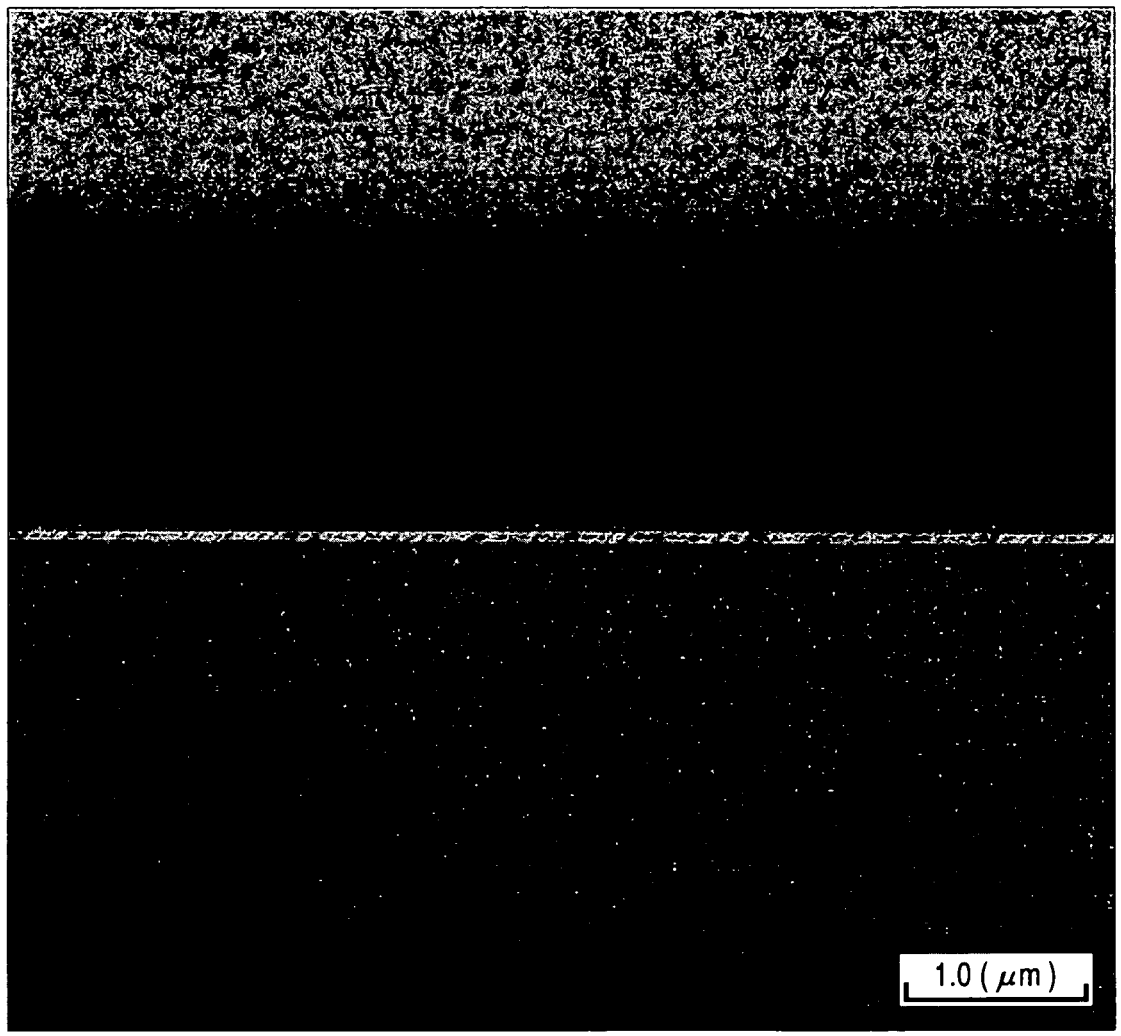
FIG. 5 is an expanded photograph illustrating an example of the interdigital transducer portion of the surface acoustic wave device according to the invention.
Figure 6:
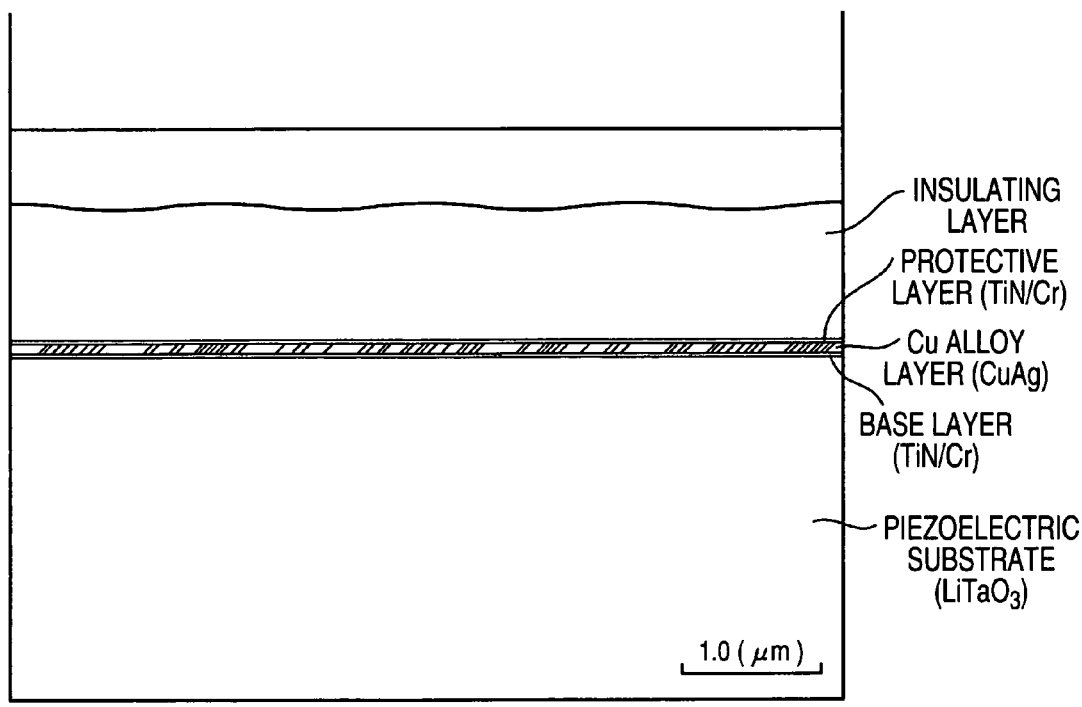
FIG. 6 is a partially expanded side view schematically illustrating a part of the interdigital transducer portion shown in FIG. 5.

The Cu alloy layer (main electrode layer) made of CuAg alloy is formed on the piezoelectric substrate made of $LiTaO_3$ having a Y-cut angle of 46° with a base layer interposed therebetween by using the sputtering method. FIG. 5 is an expanded photograph of the interdigital transducer portion of the surface acoustic wave device according to a first example in which a base layer is formed by laminating the first base layer made of TiN and the second base layer made of Cr, as viewed from a cross section orthogonal to the X axis of the $LiTaO_3$ substrate. FIG. 6 is a partial side view schematically illustrating a part of the interdigital transducer portion shown in FIG. 5.

The film thickness of the first base layer (TiN) is 5 nm, the film thickness of the second base layer (Cr) is 2 nm, the film thickness of the Cu alloy layer (CuAg) is 80 nm, the film thickness of the first protective layer (TiN) is 5 nm, and the film thickness of the second protective layer (Cr) is 5 nm. The interdigital transducer portion and the piezoelectric substrate are covered with an insulating layer made of silicon oxide.

As shown in FIGS. 5 and 6, the crystal of the CuAg alloy layer has the face-centered cubic structure and the {111} plane thereof has the constant gradient which is an acute angle with respect to the surface of the piezoelectric substrate 12. The constant gradient is 51° and is equal to a value of an angle Φ from the surface normal direction in the [111] direction of the Cu alloy layer. Moreover, the {111} plane of the Cu alloy layer is parallel to the X axis of the crystal of the piezoelectric substrate, and the {111} plane serving as the closest-packed plane crosses the amplitude direction of the SH waves.

Further, the inclination angle of the {111} plane of the first base layer and the inclination angle of the {111} plane of the Cu alloy layer are equal to each other. Moreover, the first base layer made of TiN (titanium nitride) or $TiO_xN_y$ (where 0<x<0.2, x+Y=1) has the rock-salt structure or the face-centered cubic structure, and the second base layer has the body-centered cubic structure. The crystals of the Cu alloy layer are heteroepitaxially grown on the crystals of the second base layer. At this time, the Cu alloy layer has a twin crystal structure of which a crystal grain boundary is linear and which has only two kinds of crystals that rotates by using the [111] direction as an axis. Accordingly, the growth of hillocks or voids that are generated due to diffusion of atoms which form the Cu alloy can be suppressed and thus the electromigration and the stress migration can be reduced. That is, the power resistance of the surface acoustic wave device can be improved.

Second Example

The first base layer made of TiN, the second base layer made of Cr, the Cu alloy layer (main electrode layer) made of CuAg alloy, the first protective layer made of TiN, and the second protective layer made of Cr are formed on the piezoelectric substrate made of $LiTaO_3$ having a Y-cut angle of 46° by using the sputtering method, and patterns of the interdigital transducer portion, the connection electrode portion, and the reflective electrode portion are formed. In addition, a curing process is performed at the temperature of 450° C. and under atmosphere of oxygen ($O_2$) and moisture ($H_2O$) for thirty minutes.

The interdigital transducer portion includes the first base layer (TiN; 5 nm), the second base layer (Cr; X nm), the Cu alloy layer (CuAg; 80 nm), the first protective layer (TiN; 5 nm), and the second protective layer (Cr; 5 nm). The numbers in the parentheses are the film thicknesses, respectively.

Figure 7:
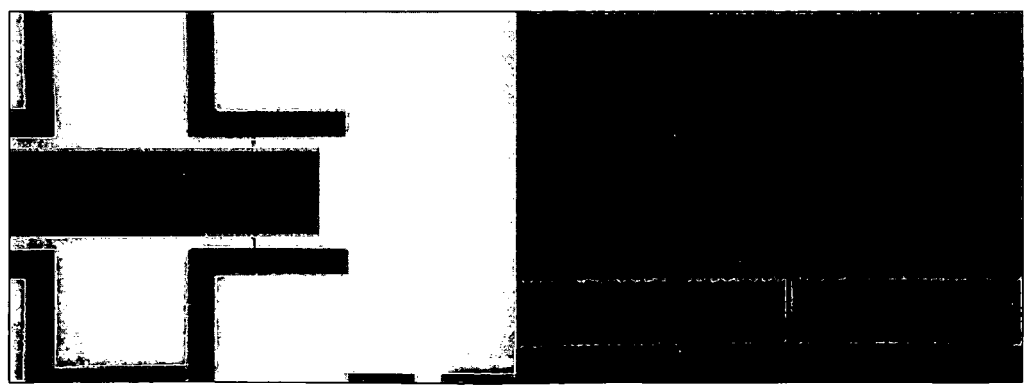
FIG. 7 is an expanded photograph illustrating another example of the interdigital transducer portion of the surface acoustic wave device according to the invention.
Figure 8:
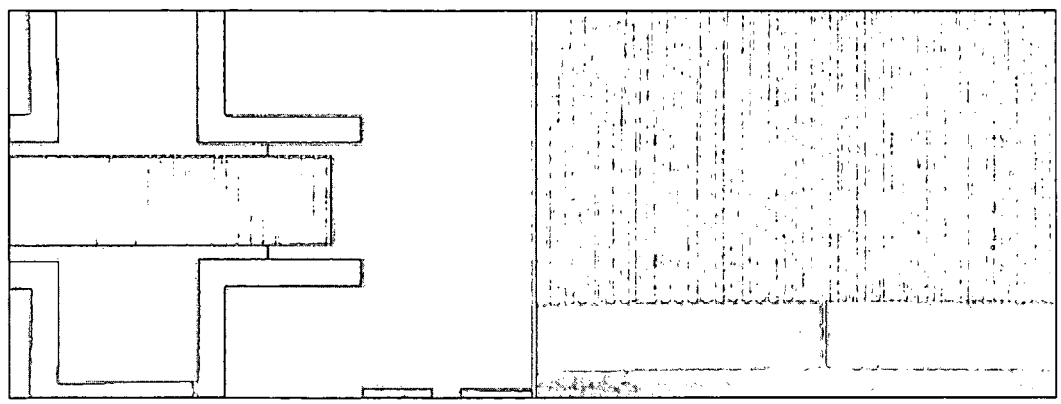
FIG. 8 is an expanded photograph illustrating another example of the interdigital transducer portion of the surface acoustic wave device according to the invention.
Figure 9:
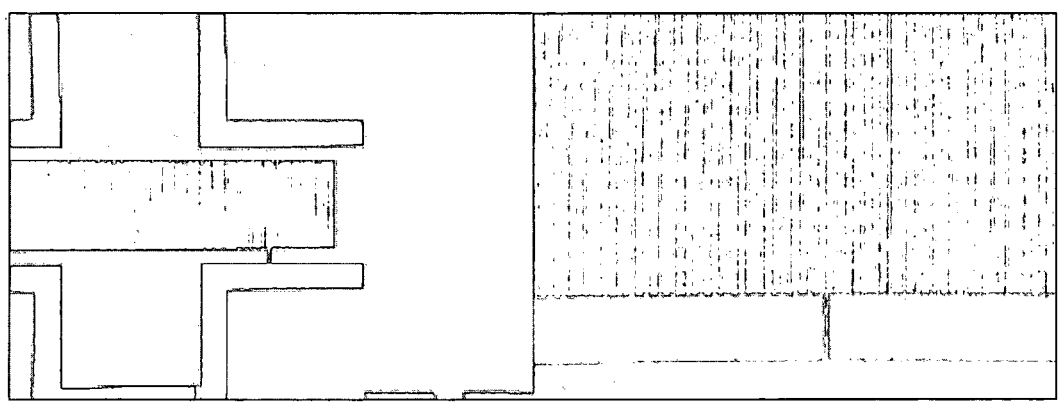
FIG. 9 is an expanded photograph illustrating another example of the interdigital transducer portion of the surface acoustic wave device according to the invention.

FIG. 7 is an expanded photograph of the surface acoustic wave device, as viewed from above, according to a second example in which the average film thickness of the second base layers of the interdigital transducer portions is set to 0.5 nm, FIG. 8 is an expanded photograph of the surface acoustic wave device, as viewed from above, according to a third example in which the average film thickness of the second base layers of the interdigital transducer portions is set to 1 nm, and FIG. 9 is an expanded photograph of the surface acoustic wave device, as viewed from above, according to a fourth example in which the average film thickness of the second base layers of the interdigital transducer portions is set to 2 nm. A right-side photograph in each of the figures is an expanded photograph of a left-side photograph.

In FIGS. 7 to 9, voids in the interdigital transducer portions of the surface acoustic wave device are not observed. Therefore, it is possible to improve the power resistance of the surface acoustic wave device. In addition, if it is possible to prevent the voids from being generated in the interdigital transducer portion, it is possible to suppress the resistance of the interdigital transducer portion from increasing so as to reduce the loss of power. In addition, it is also possible to reduce the variations in the serial resonance frequency and the parallel resonance frequency.

As such, by providing the first base layer and the second base layer, the adhesion of the interdigital transducer portions with respect to the piezoelectric substrate is improved, which prevents the voids from being generated due to the thermal stress.

Furthermore, as a comparative example, a surface acoustic wave device is formed in which only a first base layer made of TiN is interposed between a piezoelectric substrate and a Cu alloy layer (main electrode layer), and a curing process is performed at the temperature of 450° C. and under atmosphere of oxygen ($O_2$) and moisture ($H_2O$) for thirty minutes.

In the comparative example, the interdigital transducer portion includes the first base layer (TiN; 5 nm), the Cu alloy layer (CuAg; 80 nm), the first protective layer (TiN; 5 nm), and the second protective layer (Cr; 5 nm). The numbers in the parentheses are the film thicknesses, respectively.

Figure 10:
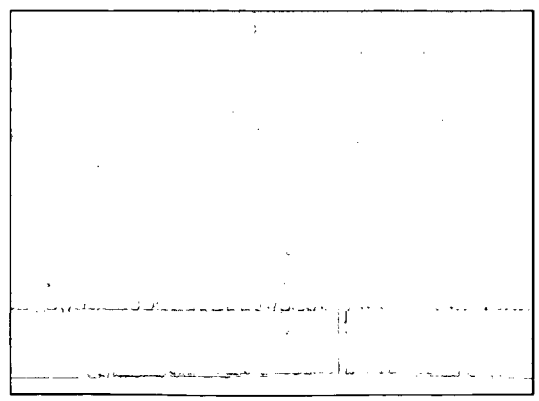
FIG. 10 is an expanded photograph illustrating an interdigital transducer portion of a surface acoustic wave device in a comparative example.
Figure 11:
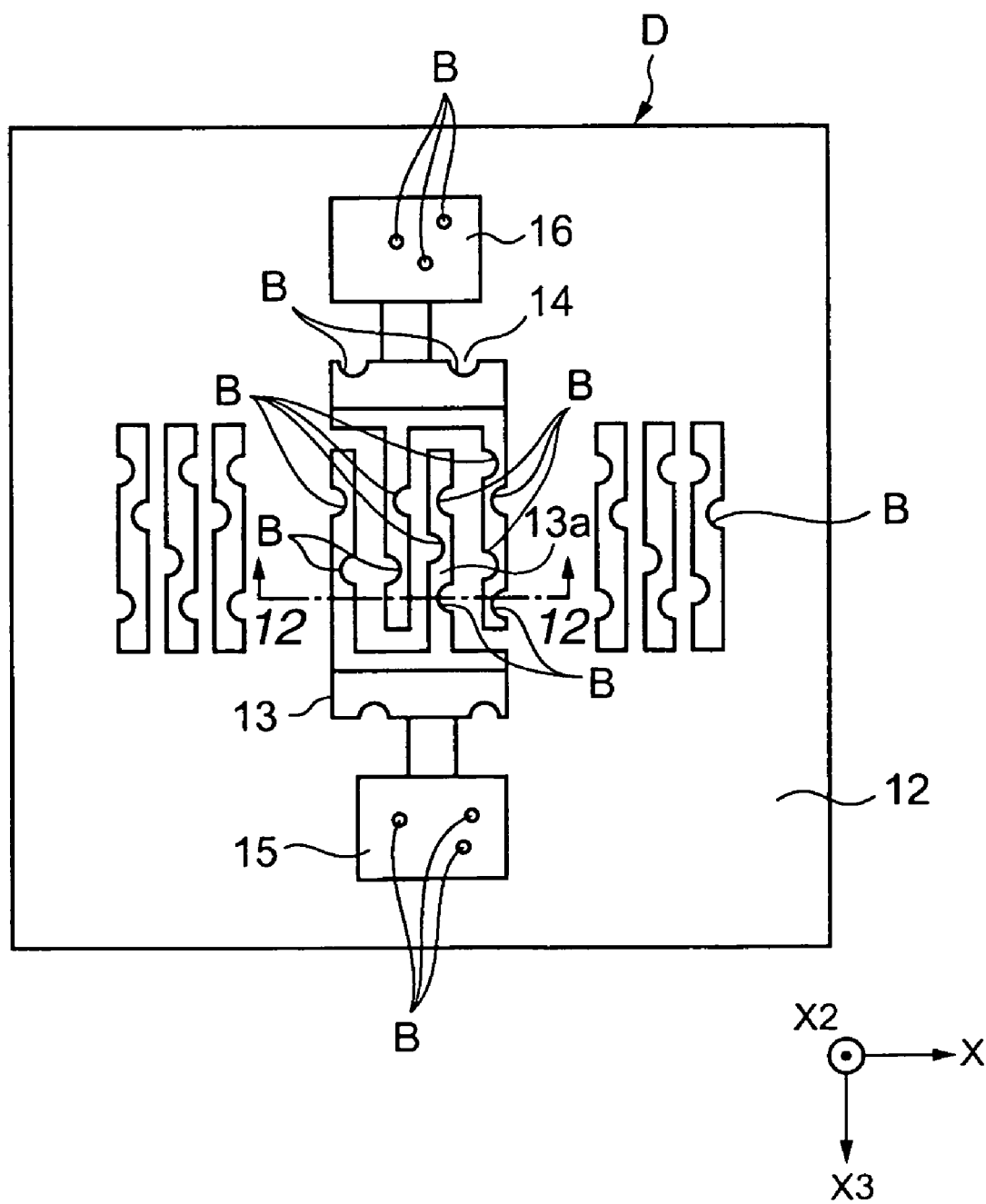
FIG. 11 is a partial plan view illustrating electrodes of a conventional surface acoustic wave device.
Figure 12:
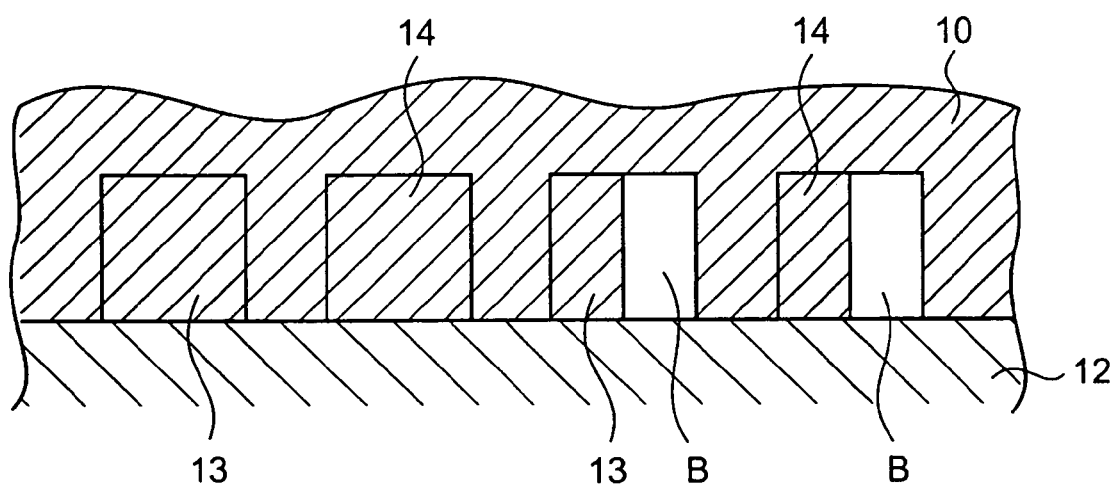
FIG. 12 is a partially cross-sectional view illustrating the electrodes of the conventional surface acoustic wave device.

FIG. 10 is a photograph of the surface acoustic wave device according to the comparative example as viewed from above.

As shown in FIG. 10, voids are generated in the interdigital transducer portions of the surface acoustic wave device in the comparative example.

That is, as described in the first to fourth examples, by providing both the first base layer made of TiN and the second base layer made of Cr between the interdigital transducer portions and the piezoelectric substrate, it is possible to prevent the voids from being generated even though the temperature of the thermal treatment is set to a high temperature, such as 450° C.

When an insulating layer is formed on the piezoelectric substrate and the interdigital transducer portions, silicon compound, such as polysilazane, is coated on the piezoelectric substrate and the interdigital transducer portions by using a spin coat method and then a thermal treatment is performed under atmosphere of oxygen ($O_2$) and moisture ($H_2O$). By the curing process, ammonia ($NH_3$) or $H_2$ is isolated from the insulating layer, and as a result, the insulating layer has silicon oxide as a main component.

If it is possible to raise the temperature of the thermal treatment, it is possible to reduce the variations even more in the serial resonance frequency and the parallel resonance frequency due to the temperature change of the surface acoustic wave device and to further improve the Q-factor of the surface acoustic wave device.

Further, if it is possible to raise the temperature of the thermal treatment, it is possible to make the film thickness of the insulating layer large. As a result, if the film thickness of the insulating layer becomes large, it is possible to reduce the variations even more in the serial resonance frequency and the parallel resonance frequency due to the temperature change of the surface acoustic wave device and to further improve the Q-factor of the surface acoustic wave device.

However, when the second base layer is formed by using Ti instead of Cr, the voids are generated in the interdigital transducer portions if the film thickness of the second base layer is not equal to or more than 10 nm. Further, if the film thickness of the second base layer is equal to or more than 10 nm, the voids are not generated in the interdigital transducer portions, but the Cu alloy layer cannot have a twin crystal structure. As a result, the power resistance decreases.

The invention claimed is:

1. A surface acoustic wave device having high power resistance, comprising:
    a piezoelectric substrate; and
    an electrode portion having a thin-film structure formed on the piezoelectric substrate,
    wherein the electrode portion has an interdigital transducer portion and a connection electrode portion connected to the interdigital transducer portion,
    the interdigital transducer portion has a base layer and a main electrode layer laminated on the base layer, and
    the base layer has a first base layer made of TiN or $TiO_xN_y$ (where, $0<x<0.2$, $x+y=1$) and a second base layer made of Cr.

2. The surface acoustic wave device having high power resistance according to claim 1,
    wherein the main electrode layer is made of Cu or a Cu alloy.

3. The surface acoustic wave device having high power resistance according to claim 2,
    wherein the main electrode layer is made of a CuAg alloy.

4. The surface acoustic wave device having high power resistance according to claim 1,
wherein a first protective layer made of TiN or $TiO_xN_y$ (where, $0<x<0.2$, $x+y=1$) is laminated on the main electrode layer.

5. The surface acoustic wave device having high power resistance according to claim 4,
wherein a second protective layer made of Cr is laminated on the first protective layer.

6. The surface acoustic wave device having high power resistance according to claim 1,
wherein the piezoelectric substrate is made of $LiTaO_3$ or $LiNbO_3$.

7. The surface acoustic wave device having high power resistance according to claim 1,
wherein the piezoelectric substrate is made of $LiTaO_3$ having a Y-cut angle within a range of 36° to 60°.

8. The surface acoustic wave device having high power resistance according to claim 1,
wherein the interdigital transducer portion and the piezoelectric substrate are covered with an insulating material having a temperature-elasticity constant variation characteristic opposite to a temperature-elasticity constant variation characteristic of the piezoelectric substrate.

9. The surface acoustic wave device having high power resistance according to claim 8,
wherein the piezoelectric substrate is an $LiTaO_3$ substrate, and the insulating material is silicon oxide or aluminum nitride.

10. The surface acoustic wave device having high power resistance according to claim 8,
wherein the insulating layer made of silicon oxide is formed by coating polysilazane on the piezoelectric substrate and then performing a thermal treatment on the polysilazane.

11. The surface acoustic wave device having high power resistance according to claim 10,
wherein the thermal treatment is performed under atmosphere of one of $O_2$ and $H_2O$ or both the $O_2$ and $H_2O$.

12. The surface acoustic wave device having high power resistance according to claim 1,
wherein the first base layer has a rock-salt crystal structure or a face-centered cubic crystal structure and the main electrode layer has a face-centered cubic crystal structure, and a {111} plane of the main electrode layer has a constant gradient with respect to a surface of the piezoelectric substrate.

13. The surface acoustic wave device having high power resistance according to claim 12,
wherein the {111} plane of the main electrode layer is parallel to an X axis of crystals of the piezoelectric substrate.

14. The surface acoustic wave device having high power resistance according to claim 12,
wherein a {111} plane of the first base layer has a constant gradient with respect to the surface of the piezoelectric substrate.

15. The surface acoustic wave device having high power resistance according to claim 1,
wherein the film thickness of the second base layer is within a range of 0.5 to 10 nm.

* * * * *